United States Patent
Kao et al.

(10) Patent No.: US 6,448,840 B2
(45) Date of Patent: *Sep. 10, 2002

(54) ADAPTIVE BODY BIASING CIRCUIT AND METHOD

(75) Inventors: James T. Kao, Cambridge, MA (US); Vivek K. De; Siva G. Narendra, both of Beaverton, OR (US); Rajendran Nair, Hillsboro, OR (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/452,080

(22) Filed: Nov. 30, 1999

(51) Int. Cl.[7] .................................................. H03K 3/01
(52) U.S. Cl. ........................ 327/534; 327/156; 327/538
(58) Field of Search ............................. 327/534, 535, 327/537, 538, 543, 541, 147, 149, 156, 158

(56) References Cited

U.S. PATENT DOCUMENTS

| 5,461,338 A | | 10/1995 | Hirayama et al. | ........... 327/534 |
| 5,909,140 A | * | 6/1999 | Choi | ........................ 327/534 |
| 5,929,695 A | * | 7/1999 | Chan et al. | ................. 327/537 |

OTHER PUBLICATIONS

Kao, J., "Soias For Temperature and Process Control", *Massachusetts Institute of Technology, 6.374 Project*, 5 pp. (Dec. 1996).

Kuroda, T., et al., "A 0.9–V, 150–MHz, 10–mW, 4mm2, 2–D Discrete Cosine Transform Core Processor with Variable Threshold–Voltage (VT) Scheme", *IEEE Journal of Solid–State Circuits, vol. 31*, 1770–1777, (Nov. 1996).

Miyazaki, M., et al., "A Delay Distrivution Squeezing Scheme with Speed–Adaptive Threshold–Voltage CMOS (SA–Vt CMOS) for Low Voltage LSIs", *1998 International Symposium on Low Power Electronics and Design Proceedings*, 48–53, (1998).

* cited by examiner

Primary Examiner—Terry D. Cunningham
Assistant Examiner—Quan Tra
(74) Attorney, Agent, or Firm—Schwegman, Lundberg, Woessner & Kluth, P.A.

(57) ABSTRACT

An adaptive body bias circuit forward or reverse biases bodies of transistors within a compensated circuit as a result of measured parameters of an integrated circuit. The adaptive body bias circuit includes a matched circuit that includes a replica of a signal path within the compensated circuit. The phase of a clock signal at the input to the matched circuit is compared to a phase of a delayed clock signal at the output of the matched circuit. When the delay through the matched circuit varies about one period of the clock signal, a non-zero error value is produced. A bias voltage is generated as a function of the error value, and the bias voltage is applied to the compensated circuit as well as the matched circuit. Integrated circuits can include many adaptive body bias circuits. Bias values can be stored in memories for later use, and bias values within memories can be updated periodically to compensate the circuit over time.

22 Claims, 4 Drawing Sheets

ADAPTIVE BODY BIASING CIRCUIT AND METHOD

FIELD

The present invention relates generally to integrated circuits, and more specifically to integrated circuits having biased transistor bodies.

BACKGROUND

Variations in transistor performance occur for a variety of reasons, including statistical variations in manufacturing processes. Variations can exist between transistors in separate integrated circuit dies, as well as between transistors on the same integrated circuit die. One such variation occurs in the threshold voltage of transistors. Threshold voltage (Vt) is the gate voltage at which a transistor turns on. If an integrated circuit design has a nominal Vt, some transistors will exhibit a Vt higher than the nominal Vt, and some transistors will exhibit a Vt lower than the nominal Vt. When Vt is high, the transistor is slower to turn on and leakage currents are low when: the transistor is off. When Vt is low, the transistor is faster to turn on and leakage currents are higher when the transistor is off.

A wide variation in Vt between different integrated circuit dies can cause some parts from a manufacturing run to fail a minimum operating frequency test, while other parts from the same manufacturing run pass the minimum operating frequency test. For example, from a single manufacturing run, some parts may be rated to operate at a frequency of 900 Megahertz (MHZ), while others may be rated to operate at 1 Gigahertz (GHz). It may be that parts capable of functioning at 1 GHz are more profitable, and so parts rated at 900 MHZ produce less profit.

Variations in Vt can also needlessly waste power. It may be that some parts rated to operate at 1 GHz can actually run at 1.1 GHz because of low Vt across critical portions of the circuit. The part may be rated at 1 GHz, and the excess capability is not utilized. Along with the excess speed capability, low Vt can cause an increase in leakage currents. When Vt is lower than necessary, the leakage currents are higher than necessary, resulting in wasted power.

Transistor Vt can also change over time as a result of time varying phenomena such as hot carrier degradation. An integrated circuit die that operates just over 1 GHz may be characterized as a 900 MHZ part to take into account the changing Vt over the life of the integrated circuit. An inability to modify Vt during the life of the integrated circuit can cause devices to be rated below their actual capability when fabricated. This costs manufacturers money.

Various: approaches have been attempted to mitigate the aforementioned problems. Miyazaki utilizes a reverse biasing technique to "squeeze" the distribution of device delays. See M. Miyazaki et al., "A Delay Distribution Squeezing Scheme with Speed-Adaptive Threshold-Voltage CMOS (SA-Vt CMOS) for Low Voltage LSIs," 1998 International Symposium on Low Power Electronics and Design Proceedings, pp. 48–53, 1998. Kao utilizes Dual Gate Silicon On Insulator technologies for biasing circuits. See J. Kao, "SOIAS For Temperature and Process Control," Massachusetts Institute of Technology, 6.374 Project, December 1996.

For the reasons stated above, and for other reasons stated below which will become apparent to those skilled in the art upon reading and understanding the present specification, there is a need in the art for reducing variations in threshold voltages of transistors.

SUMMARY

In one embodiment, a method of biasing the body of a transistor, includes measuring a parameter of the transistor, and responsive to the parameter, forward biasing the body of the transistor. The parameter being measured can be, among other things, a voltage threshold of the transistor, or a delay characteristic of the transistor.

In another embodiment, a method of biasing a compensated circuit includes measuring a delay in a matched circuit, the matched circuit including a replica of a signal path within the compensated circuit, and comparing the delay with a predetermined delay to generate a bias value. The method further includes biasing the matched circuit and the compensated circuit in response to the bias value.

In another embodiment, a method of delay matching includes partitioning an integrated circuit into a plurality of blocks capable of being independently biased and measuring characteristic circuit delays within each of the plurality of blocks. The method further includes independently biasing each of the plurality of blocks in response to the characteristic circuit delays within each of the plurality of blocks.

In another embodiment, an adaptive bias generator includes a matched circuit having a clock input node, a clock output node, and a bias input node. The adaptive bias generator further includes a phase comparator having a first input node coupled to the clock output node of the matched circuit, a second input node coupled to the clock input node of the matched circuit, and an output node, and also further includes a digital-to-analog converter responsive to an error value on the output node of the phase comparator, the analog to digital converter having an output node coupled to the bias input node of the matched circuit.

In another embodiment, an integrated circuit includes at least one circuit block, the at least one circuit block comprising at least one transistor disposed within a well, the well having a bias input node, and an adaptive bias generator for each of the at least one circuit block, the adaptive bias generator being configured to provide a voltage value on the bias input node responsive to a measured parameter.

DESCRIPTION OF EMBODIMENTS

Figure 1:
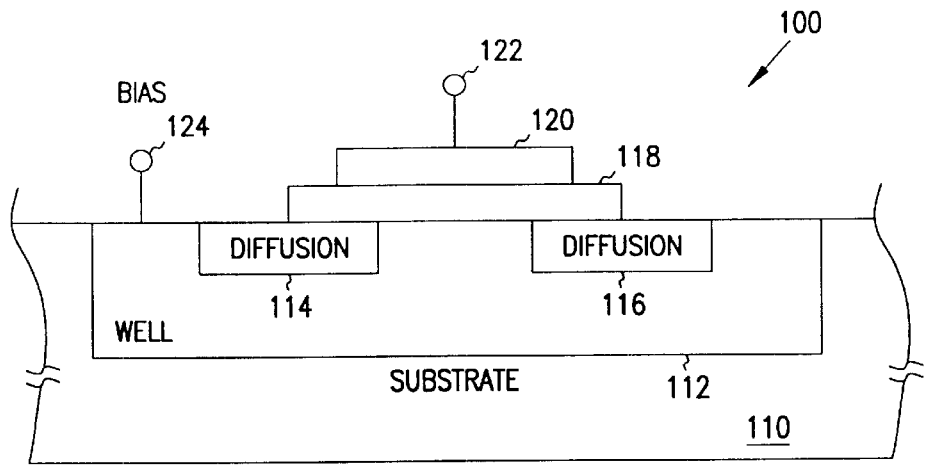
FIG. 1 is a cross section of a transistor according to one embodiment of the present invention.

In the following detailed description of the embodiments, reference is made to the accompanying drawings which, by way of illustration, show specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

FIG. 1 shows a cross section of a transistor in accordance with one embodiment of the invention. Integrated circuit 100 includes a transistor formed by gate 120, insulator 118, and diffusion regions 114 and 116 within well 112. Well 112 is in turn within substrate 110. Well 112 and diffusion regions 114 and 116 are of two different material types. For example, when the transistor is a PMOS FET, diffusion regions 114 and 116 which form a source and drain region are P+ diffusion regions, and well 112 is an N well. In this embodiment, substrate 110 can be a P substrate, or other substrate capable of accepting an N well, such as a substrate used in Silicon On Insulator (SOI) technologies. Substrate 110 can also be a P well disposed between well 112 and another substrate. Also for example, when the transistor is an NMOS FET, diffusion regions 114 and 116 which form a source and drain region are N+ diffusion regions, and well 112 is a P well. In this embodiment, substrate 110 can be an N substrate, or other substrate capable of accepting a P well, such as a substrate used in Silicon On Insulator (SOI) technologies. Substrate 110 can also be an N well disposed between well 112 and another substrate such as a P substrate, such as in a triple-well process.

One skilled in the art will understand that many transistors can be included within a single well. For example, groups of PMOS transistors can be built within a single N well, and groups of NMOS transistors can be built within a single P well. Alternatively, each transistor can have its own well, with bias voltages distributed to groups of transistors.

Node 124 is coupled to well 112. Conventional methods for coupling node 124 to well 112 are contemplated, including the addition of a separate diffusion region within well 112. Typically, wells (or bodies) of PMOS transistors are tied to Vcc, the highest potential within the circuit, and wells of NMOS transistors are tied to Vss, the lowest potential within the circuit. A bias voltage other than Vcc or Vss can be applied to node 124, thereby changing the voltage of well 112, and applying a "body bias" to transistors included within well 112. Body biasing can have multiple effects on transistors, including modifying Vt, the voltage threshold of the device; modifying the speed at which the device operates; and also changing leakage currents.

For example, in a PMOS device, when a body bias is applied above the most positive supply voltage (Vcc), the PMOS device has a reverse body bias. When a reverse body bias exists, Vt is raised, the device is slower, and leakage currents are smaller. When a body bias below Vcc is applied to a PMOS device, the PMOS device has a forward body bias resulting in lower Vt, faster operation, and increased leakage currents Also for example, in an NMOS device, when a body bias is applied above the least positive supply voltage (Vss), the NMOS device has a forward body bias resulting in lower Vt, faster operation, and increased leakage currents: When a body bias is applied below Vss to an NMOS device, the NMOS device has a reverse body bias-resulting in higher Vt, slower operation, and decreased leakage currents.

Transistors turn on when the gate voltage is larger than the threshold voltage Therefore, for smaller threshold voltages, transistors turn on when smaller gate voltages are applied. Lower Vt devices are higher performance devices because they turn on quicker. Leakage currents increase exponentially as Vt drops, and as a result, as Vt drops, speed performance increases at the expense of additional power dissipation. Lower Vt is becoming more important, because as supply voltages become smaller, Vt in devices is also falling so that the devices can operate within the lower supply voltages.

Figure 2:
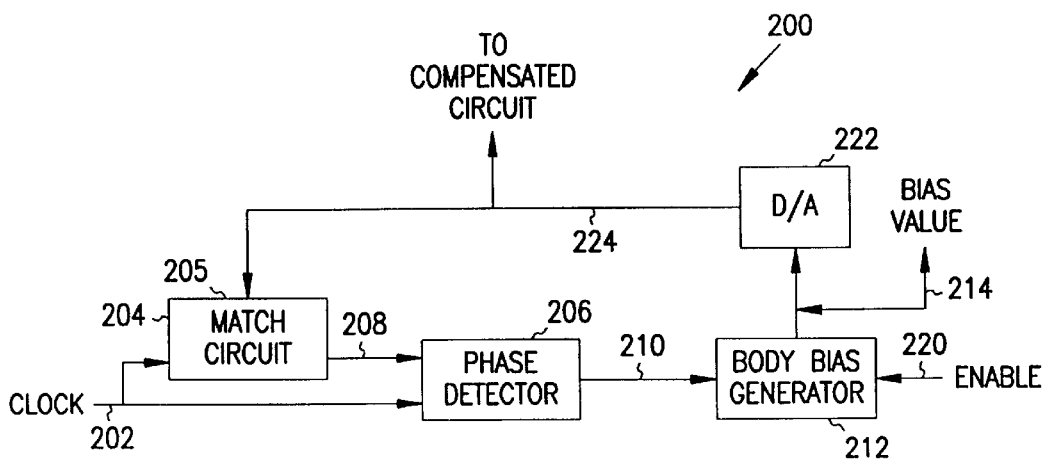
FIG. 2 is an adaptive body bias circuit according to one embodiment of the present invention.

FIG. 2 shows an adaptive body bias circuit in accordance with one embodiment of the present invention. Adaptive body bias circuit 200 includes matched circuit 204, phase detector 206, body bias generator 212, and digital-to-analog converter (D/A) 222. Adaptive body bias circuit 200 functions to bias a circuit such as one included within integrated circuit 100 (FIG. 1). A bias voltage is produced on node 224 which is coupled to a circuit node, such as bias node 124 (FIG. 1), thereby biasing a circuit. For ease of explanation, the circuit being biased is herein referred to as the "compensated circuit." In FIG. 2, the compensated circuit receives at least one bias voltage from node 224.

Matched circuit 204 receives a signal on node 202. In the embodiment of FIG. 2, the signal on node 202 is a clock signal. The clock signal impressed on node 202 is a "target clock" having a frequency substantially equal to a desired frequency of operation of the compensated circuit. Matched circuit 204 includes a replica of a critical signal path included within the compensated circuit. For example, when the compensated circuit is a ripple carry adder, the critical signal path can be the carry path from the least significant bit of the adder to the most significant bit of the adder. In this embodiment, matched circuit 204 includes a replica of the circuit elements included within the carry path of the compensated circuit.

The signal path replica included within matched circuit 204 serves as a test circuit to determine the salient circuit characteristics of the compensated circuit. For example, the compensated circuit may be fast or slow based on the process used in manufacturing or based on normal variations in the manufacturing process. If the compensated circuit is very fast, the signal path replica included within matched circuit 204 will also be very fast. Likewise, if the compensated circuit is very slow, the signal path replica included within matched circuit 204 will also be very slow. Matched circuit 204 introduces a delay between node 202 and node 208 substantially equal to the delay of the signal path of the compensated circuit.

If the delay introduced by matched circuit 204 is greater than one period of the target clock impressed on node 202, the integrated circuit may be too slow to meet predetermined specified operating limits. In this case, biasing the circuit for increased speed can bring the device back within specified limits. On the other hand, if the delay introduced by matched circuit 204 is substantially less than one period of the target clock impressed on node 202, the integrated circuit may be needlessly fast, and as a: result, may needlessly dissipate excess power. In this case, biasing the circuit for decreased speed can save power while maintaining the device within specified operating limits.

Matched circuit 204 also includes bias input node 205. Bias input node 205 is coupled to bias input nodes such as node 124 (FIG. 1) of transistors included within matched circuit 205. A bias voltage on node 224 biases circuits within matched circuit 205. In one embodiment, node 224 includes multiple nodes such that multiple bias voltages can be provided on bias input node 205 of matched circuit 204. In this embodiment, one bias voltage can be provided to PMOS devices and another bias voltage can be provided to NMOS devices.

Phase detector 206 receives the target clock impressed on node 202, and also receives a delayed clock on node 208 from matched circuit 204. The delayed clock on node 208 has undergone a delay substantially equal to the delay of the signal path of the compensated circuit. When the delayed clock has undergone a delay substantially equal to one period of the target clock, the phase difference between the target clock and the delayed clock will be substantially zero. When the delayed clock has undergone a delay different than one period of the target clock, the phase difference between the target clock and the delayed clock will not be zero.

In some embodiments phase detector 206 compares the phase of the target clock on input node 202 and the phase of the delayed clock on node 208, and produces an error value on node 210. The error value on node 210 has a parameter such as magnitude proportional to the phase difference between the target clock and the delayed clock. In other embodiments, phase detector 206 compares the phase of the target clock on input node 202 and the, phase off the delayed clock mode 208, and produces one or more digital control signals on node 210. The digital control signals can be signals that take on three values corresponding to the conditions of "increase the delay," "decrease the delay," and "keep the delay constant." In one such embodiment, body bias generator 212 includes a digital counter circuit, and the control signals on node 210 cause the counter to count up down or stay constant.

In the embodiment of FIG. 2, the error value on node 210 is one component of a negative feedback loop that controls a body bias of matched circuit 204. The feedback loop, operates to modify the body bias of the signal path circuit to either increase or decrease the speed of the circuit such that the error value on node 210 is driven to a state that no longer causes body bias generator 212 to change the bias value on node 214. When this is the case, the delay through the signal path of the compensated circuit is substantially equal to one clock period of the target clock on node 202.

Body bias generator 212 receives the error value on node 210 and generates a bias value on node 214. In one embodiment, body bias generator 212 produces digital values representing bias values on node 214. In one embodiment, node 214 is capable of carrying a single bias value. In this embodiment, body bias generator 212 generates a single bias value for body biasing a single transistor or group of transistors. In another embodiment, node 214 can carry multiple bias values. In this embodiment, the bias values on node 214 can body bias multiple transistors or multiple groups of transistors. For ease of explanation, node 214 is hereinafter described as having a single bias value impressed thereon. In all cases, multiple bias values can be included on node 214.

Body bias generator 212 includes a transfer function to map an error value to one or more appropriate bias values. The transfer function within body bias generator 212 can be implemented using one of many possible methods including dedicated circuits that implement a mathematical function, or a memory circuit functioning as a look-up table that produces bias values as a function of error values. Body bias generator 212 also includes enable input node 220. Enable input 220 functions to command body bias generator 212 to drive a bias value on node 204. Enable input 220 also functions to command body bias generator 212 to not drive a bias value on node 214. When body bias generator 212 does not drive a bias value on node 214, a value can be driven onto node 214 by other circuits connected thereto. One embodiment incorporating this functionality is discussed in more detail with reference to FIG. 3 below.

Digital-to-analog converter (D/A) 222 receives the bias value on node 214 and produces an analog bias voltage on node 224. As discussed above, node 224 can include multiple nodes, each including a different bias voltage. For example, when body bias generator 212 produces two digital bias values on node 214, D/A 222 produces two analog voltages on node 224. Voltages on node, 224 are bias voltages used to bias the bodies of transistors in both matched circuit 204 and in the compensated circuit. In other embodiments, D/A 222 and body bias circuit 200 are replaced with a continuously running charge pump.

The operation of the negative feedback loop in adaptive body bias circuit 200 serves to adjust the delay of matched circuit 204 such that operation at a target clock frequency is possible. Because matched circuit 204 includes circuit elements matched to elements in the compensated circuit, adaptive body bias circuit 200 produces bias voltages on node 224 that bias the compensated circuit such that it will operate efficiently at the frequency of the target clock. If the compensated circuit was originally too slow, bias voltages on node 224 increase the speed of the circuit by applying a forward body bias to make operation at the target clock frequency possible. Alternatively, if the speed of the circuit is needlessly fast, bias voltages on node 224 decrease the speed of the circuit by applying a reverse body bias, thereby saving power while still allowing operation at the target clock frequency.

By selectively applying forward and reverse biases to transistors or groups of transistors, some transistors are reduced in speed while others are increased in speed. As technology scaling continues, and transistors continue to get smaller, Vt variations are likely to increase. Reverse biasing alone can slow down devices that are too fast for a particular implementation, but reverse biasing can also worsen variation In Vt, resulting in even greater Vt variation. By providing both forward and reverse body biasing, the method and apparatus of the present invention reduces the effective Vt variation.

Adaptive body bias circuit 200 can be used to adjust bias voltages during testing of a device or during burning-in of a device to compensate for variations in the manufacturing process. In this embodiment, enable input node 220 of body bias generator 212 causes body bias generator 212 to hold a bias value on node 214. During testing, enable input node 220 is used to command body bias generator 212 to function as a component within the loop. During this time, the loop is closed, and the operation of adaptive body bias circuit 200 is as previously described. The loop operates for a period of time and the body bias values converge to stable values. After bias voltages on node 224 are stable, enable input node 220 is used to command body bias generator 212 to hold a static bias value on node 214 regardless of the error value received on node 210. This effectively locks the bias value to a static value for the remainder of the life of the integrated circuit within which adaptive body bias circuit 200 exists.

In another embodiment, adaptive body bias circuit 200 can be utilized throughout the life of the integrated circuit within which adaptive body bias circuit 200 exists. In this embodiment, adaptive body bias circuit 200 can be used during testing to compensate for manufacturing variances as previously described, and can also be used at multiple times throughout the life of the integrated circuit to compensate for time varying phenomena that have effects on circuit characteristics such as Vt. Examples of time varying effects include hot carrier degradation and threshold voltage drift. One embodiment that allows for operation of adaptive body bias circuit 200 throughout the life of the integrated circuit is discussed with reference to FIG. 3 below.

Figure 3:
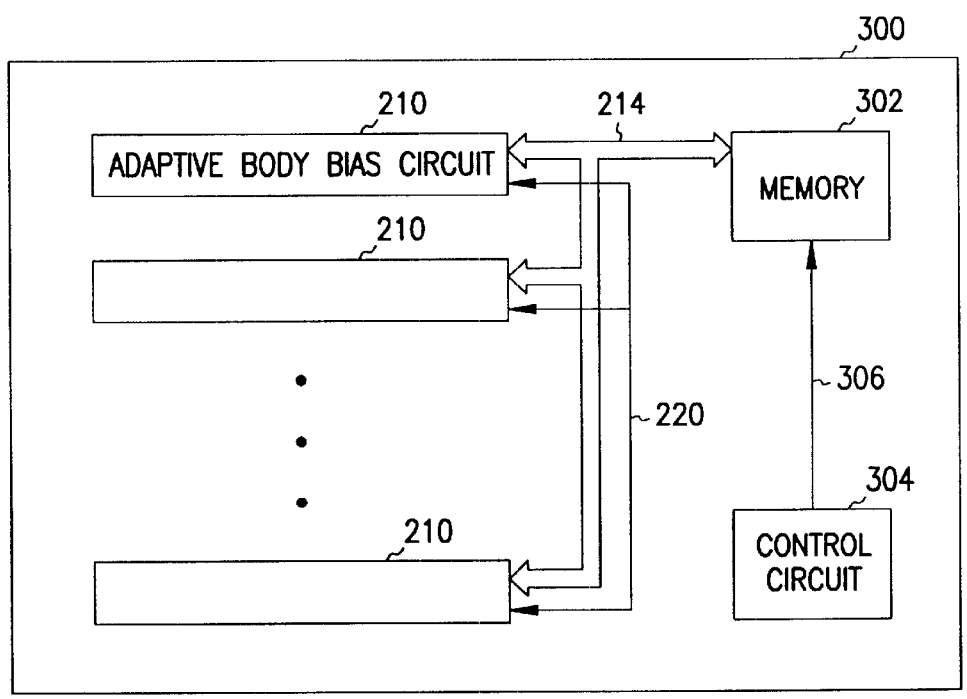
FIG. 3 is an integrated circuit according to one embodiment of the present invention.

FIG. 3 shows an integrated circuit in accordance with one embodiment of the present invention. Integrated circuit 300 includes at least one adaptive body bias circuit 210. Adaptive body bias circuit 210 can be any embodiment disclosed herein, such as adaptive body bias circuit 200 (FIG. 2). Adaptive body bias circuit 210 is bi-directionally coupled to memory 302 via node 214. Node 214 carries bias values between adaptive body bias circuit 210 and memory 302. Adaptive body bias circuit 210 is also coupled to control circuit 304 via enable node 220. Enable node 220 is output from control circuit 304, and input to adaptive body bias circuit 210.

Each adaptive body bias circuit 210 included within integrated circuit 300 functions to bias a portion of integrated circuit 300. In one embodiment, each of adaptive body bias circuit 210 determines bias voltage values appropriate for the portion of integrated circuit 300 to which it is coupled. Those bias values are used to bias circuits, and are also output on node 214. This allows delays within different portions of the integrated circuit to be matched.

In operation, control circuit 304 commands adaptive body bias circuit and memory 302. Control circuit 304 can include a hardware timer that periodically asserts a signal on enable node 220, thereby causing adaptive body bias circuits 210 to adaptively adjust bias values and to output those values on node 214. Alternatively, control circuit 304 can be a processor within integrated circuit 300, or can be a processor interface that allows integrated circuit 300 to communicate with a processor external to integrated circuit 300 for the purposes of controlling memory 302 and adaptive body bias circuits 210.

In one embodiment, control circuit 304 commands adaptive body bias circuits 210 to adaptively generate bias voltages when integrated circuit 300 is being tested or burned-in. At this time, control circuit 304 also commands memory 302 via commands on node 306 to accept bias values on node 214. Memory 302 is capable of storing many bias values received on node 214. In one embodiment, each adaptive body bias circuit 210 is commanded separately by-control circuit 304 to output bias values on node 214. Also in this embodiment, memory 302 is commanded by control circuit 306 to accept each of the bias values output in turn on node 214 by each of the adaptive body bias circuits 210. After memory 302 has received bias values on node 214, control circuit 304 commands adaptive body bias circuits 210 to accept and use bias values from node 214. Memory 302 is commanded by control circuit 304 to output bias values onto node 214 for use by adaptive body bias circuits 210.

In one embodiment, control circuit 304 periodically commands adaptive body bias circuits 210 to adaptively generate bias values and output them on node 214. In this manner, bias values stored within memory 302 are updated to take into account circuit changes that affect the speed of portions of integrated circuit 300. Bias values included within memory 302 can be updated often, or very infrequently.

Integrated circuit 300 can be any type of integrated circuit capable of benefiting from the method and apparatus of the present invention. For example, integrated circuit 300 can be a processor such as a microprocessor, digital signal processor, microcontroller, or the like. Integrated circuit 300 can also be a memory device, a synchronous memory device, or an application-specific integrated circuit (ASIC).

Having multiple adaptive body bias circuits 210 can help to create a tight distribution of Vt values across a large integrated circuit. Integrated circuits have Vt variations that exist across the entire die. When the die is subdivided into regions, each region is likely to have a smaller Vt variation than the whole die. Each of the body bias circuits 210 can then work to control the smaller Vt variation that exists in the region.

Figure 4:
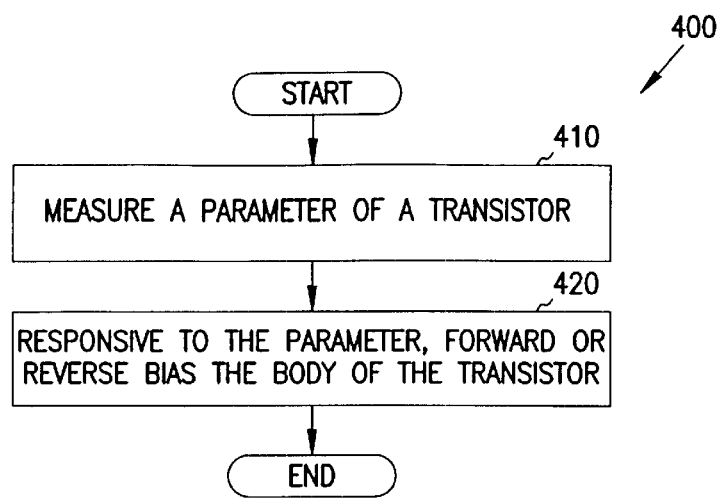
FIG. 4 is a flowchart of a method for biasing the body of a transistor according to one embodiment of the present invention.

FIG. 4 is a flowchart of a method for biasing the body of a transistor according to one embodiment of the present invention. Method 400 begins with action box 410 when a parameter of the transistor is measured. The measured parameter can be one of many possible parameters, including a voltage threshold or a delay. In action box 420, the body of the transistor is forward or reverse biased responsive to the parameter. The transistor of method 400 can be the transistor of FIG. 1. When the transistor of method 400 is the transistor of FIG. 1, the body is forward or reverse biased by applying a bias voltage to bias node 124. Forward biasing a transistor can lower the threshold voltage and decrease delay, thereby increasing the speed with which the transistor operates.

Figure 5:
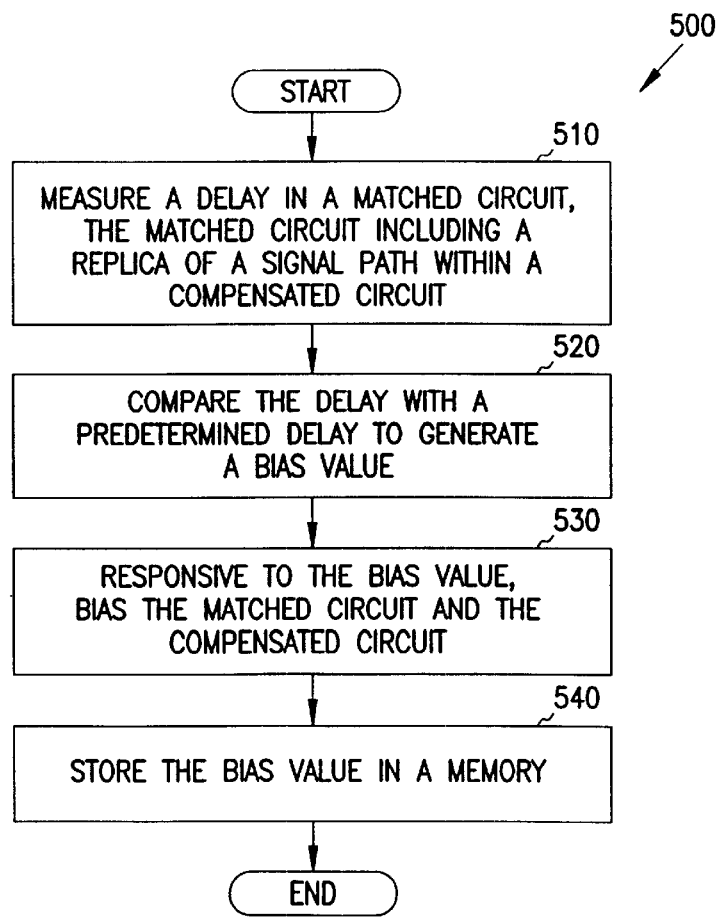
FIG. 5 is a flowchart of a method for biasing a compensated circuit according to one embodiment of the present invention.

FIG. 5 is a flowchart of a method for biasing a compensated circuit according to one embodiment of the present invention. Method 500 begins in action box 510 when a delay in a matched circuit is measured. The matched circuit of action box 510 includes a replica of a signal path within a compensated circuit. The matched circuit of action box 510 can be matched circuit 204 (FIG. 2).

In action box 520, the delay measured in action box 510 is compared with a predetermined delay to generate a bias value. The predetermined delay of action box 520 can be substantially equal to a period of a target clock. The comparison can be performed by a phase detector such as phase detector 206 (FIG. 2). The bias value generated can change in either a positive direction or a negative direction as a function of the delay values being compared.

In action box 530, the matched circuit and the compensated circuit are biased responsive to the bias value. The matched circuit is biased in action box 530, and as a result, the delay measured in action box 510 may change. This is analogous to a closed loop, such as the negative feedback loop as shown in FIG. 2.

In action box 540, the bias value generated in action box 520 is stored in a memory. The bias value stored in the memory can be used to bias the matched circuit and the compensated circuit. In one embodiment, method 500 is performed once when an integrated circuit is tested or burned-in. The bias value stored in the memory is used from then on to bias the compensated circuit. In another embodiment, method 500 is performed periodically, and the bias value in the memory is periodically updated. In this embodiment, time varying changes in the compensated circuit can be detected and further compensated for.

Figure 6:
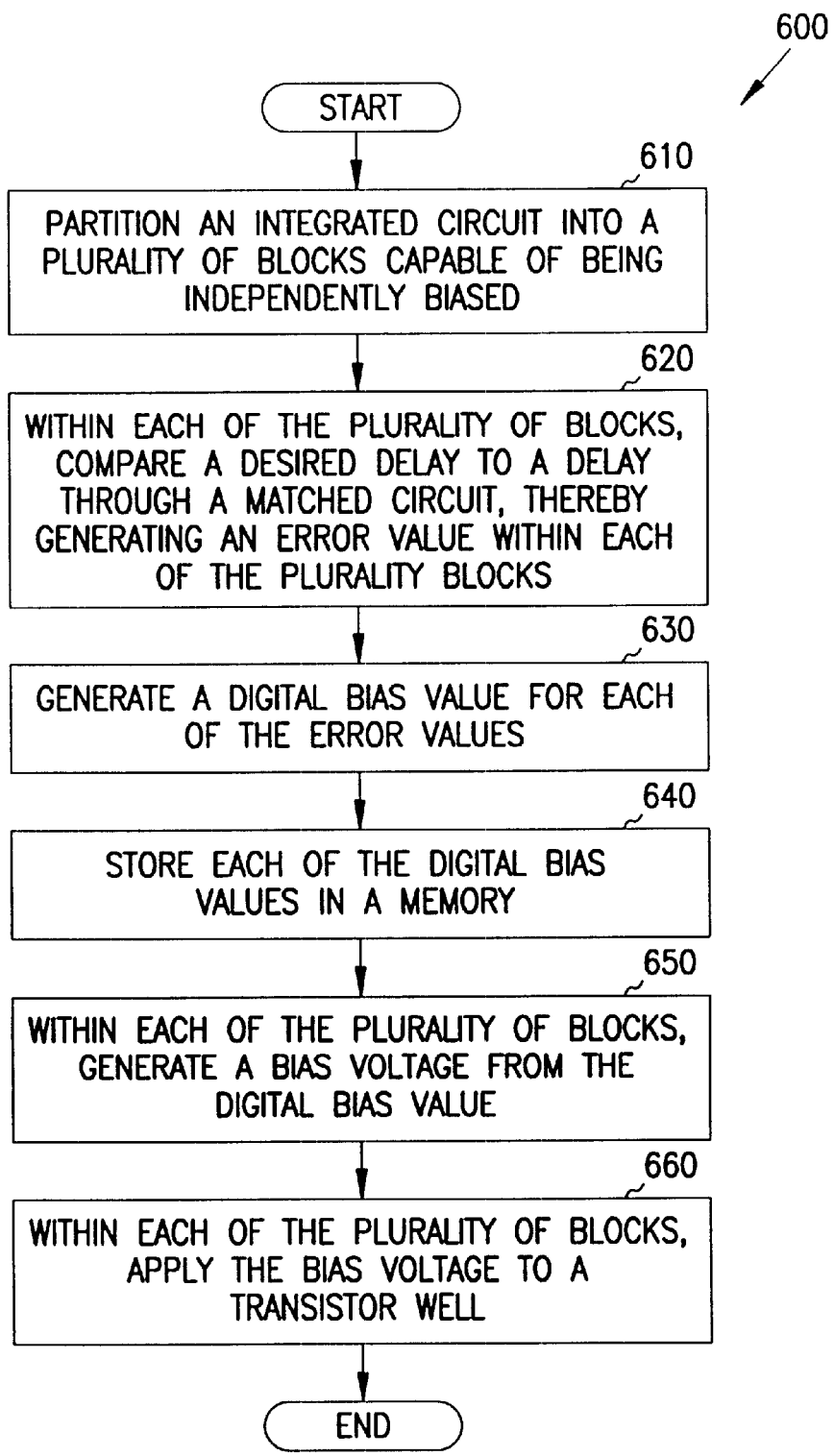
FIG. 6 is a flowchart of a method for delay matching according to one embodiment of the present invention.

FIG. 6 is a flowchart of a method for delay matching according to one embodiment of the present invention. Method 600 begins in action box 610 when an integrated circuit is partitioned into a plurality of blocks capable of being independently biased. In one embodiment, this corresponds to partitioning the circuit along functional boundaries. For example, a processor may be partitioned such that a multiplier is in one block, and a register file is in another block. Transistors in each block are capable of being biased as a group. Transistors in each block can share a well such as well 112 (FIG. 1), or each of the transistors in a block can exist in a separate well, each well having a bias input node coupled to a common node.

In action box 620, a delay through a matched circuit is compared to a desired delay. The comparison results in an error value. The comparison of action box 620 can be performed by a phase detector, such as phase detector 206 (FIG. 2), and the resulting error value can be the error value produced on node 210. The actions performed within action box 620 are performed for each of the plurality of blocks. For example, each block includes a matched circuit having a delay. Each block also compares the desired delay to the delay of the matched circuit included therein. Also, each block generates a separate error value. The plurality of blocks as described in action boxes 610 and 620 can be adaptive body bias circuits 210 (FIG. 3).

In action box 630 digital bias values are generated for each of the error values. Digital bias values can be generated from error values in multiple possible manners, including the use of a mathematical function or look-up table. In action box 640, each of the digital bias values is stored in a memory. The memory of action box 640 can be memory 302 (FIG. 3). In this embodiment, a single memory holds digital bias values for each of the plurality of blocks.

In action box 650, a bias voltage is generated from the digital bias values within each of the plurality of blocks. In one embodiment, the bias voltage is generated with a D/A converter such as D/A converter 222 (FIG. 2). In action box 660, the bias voltage is applied to a transistor well within each of the plurality of blocks. The transistor well can include multiple transistors such that multiple transistors are biased at once. The transistor well can also include a single transistor.

Conclusion

Because of variations in manufacturing, some integrated circuits operate faster than others. One possible factor contributing to the differences is varying threshold voltage among different transistors across the device. By utilizing the method and apparatus of the present invention, the variations in threshold voltage across the device can be reduced, thereby allowing multiple integrated circuits subject to manufacturing variations to be closer in performance and power consumption.

When device to device variations are so great that specified operating boundaries are crossed, devices are separated into bins during testing such that some devices are sold as lower performance devices. This is analogous to a lowered yield, and can cost manufacturers money. The method and apparatus of the present invention can speed up the slower devices, thereby improving yield, and can slow down the faster devices, thereby decreasing unnecessarily high power consumption. The result is a narrower distribution of performance and power consumption within a batch of integrated circuits.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An adaptive bias generator comprising:
    a matched circuit having a clock input node, a clock output node, and a bias input node;
    a phase comparator having a first input node coupled to the clock output node of the matched circuit, a second input node coupled to the clock input node of the matched circuit, and an output node;
    a digital-to-analog converter respersive to an error value on the output node of the phase comparator, the digital-to-analog converter having an output node coupled to the bias input node of the matched circuit;
    a body bias generator coupled between the output node of the phase comparator and the digital-to-analog converter, the body bias generator being configured to map the error value to at least one bias value, wherein the digital-to-analog converter is responsive to the at least one bias value; and
    a memory configured to receive and to store the at least one bias value.

2. The adaptive bias generator of claim 1 further comprising a control circuit configured to command the adaptive bias generator to update the at least one bias value for storing in the memory.

3. The adaptive bias generator of claim 1 wherein the output node of the digital-to-analog converter is coupled to an N well having a PMOS transistor disposed therein.

4. The adaptive bias generator of claim 1 wherein the output node of the digital-to-analog converter is coupled to a P well having an NMOS transistor disposed therein.

5. An integrated circuit comprising:
    at least one circuit block, the at least one circuit block comprising at least one transistor disposed within a well, the well having a bias input node; and
    an adaptive bias generator for each of the at least one circuit block, the adaptive bias generator being configured to provide a voltage value on the bias input node, wherein the adaptive bias generator comprises:
        a matched circuit that includes a replica of a signal path within the at least one circuit block, the matched circuit having a clock input node, a clock output node, and a bias input node;
        a phase comparator having two input nodes coupled to the clock input node and clock output node respectively, to produce an error value, wherein the adaptive bias generator is configured to generate at least one digital bias value from the error value; and
        a digital-to-analog converter configured to produce the voltage value responsive to the at least one digital bias value;
    the integrated circuit further comprising a memory to store the at least one digital bias value from the adaptive bias generator, and a control circuit configured to command the memory to store the at least one bias value.

6. The integrated circuit of claim 5 wherein the transistor is a PMOS transistor, and the well is an N well.

7. The integrated circuit of claim 5 wherein the transistor is an NMOS transistor, and the well is a P well.

8. The integrated circuit of claim 5 wherein the integrated circuit is of a silicon-on-insulator (SOI) type.

9. The integrated circuit of claim 5 wherein the control circuit is a processor interface adapted to communicate with a processor external to the integrated circuit.

10. The integrated circuit of claim 5 wherein the control circuit includes a hardware timer such that the memory is commanded to store the at least one bias value at fixed periodic intervals.

11. An apparatus to modify a threshold voltage of a transistor comprising:

an input clock node to receive an input clock signal;

a circuit to receive the input clock signal on the input clock node and to produce a delayed clock signal;

a phase comparator to compare the phase of the delayed clock signal and the input clock signal; and a feedback circuit responsive to the phase comparator to modify the threshold voltage of the transistor, wherein the feedback circuit comprises:

a body bias generator responsive to the phase comparator to generate a digital bias value;

an digital-to-analog converter to receive the digital bias value and bias the transistor;

a memory circuit to store the digital bias value; and a signal path from the body bias generator to the memory circuit.

12. The apparatus of claim 11 wherein the transistor is included within the circuit that produces the delayed clock signal.

13. The apparatus of claim 11 further comprising a compensated circuit that includes the transistor.

14. The apparatus of claim 11 wherein the feedback circuit further comprises a second signal path from the memory circuit to the digital-to-analog converter.

15. A method of modifying the threshold voltage of a transistor comprising:

receiving an input clock signal on a clock input node;

delaying the clock signal in a circuit to produce a delayed clock signal;

comparing the phase of the input clock signal and the delayed clock signal to produce an error signal;

responsive to the error signal, creating a digital bias value from the error signal, converting the digital bias value to an analog bias voltage, and applying the analog bias voltage to a bias node of the transistor; and storing the digital bias value in a memory.

16. The method of claim 15 wherein the transistor is used in a compensated circuit, and wherein delaying the clock signal comprises delaying the clock signal in a circuit matched to the compensated circuit.

17. The adaptive bias generator of claim 1 further comprising a control circuit configured to command the memory to store the at least-one bias value.

18. The apparatus of claim 11 further comprising a control circuit configured to command the memory to store the digital bias value.

19. The apparatus of claim 18 wherein the control circuit comprises a processor interface adapted to communicate with a processor.

20. The apparatus of claim 18 wherein the control circuit includes a hardware timer such that the memory is commanded to store the digital bias value at fixed periodic intervals.

21. The method of claim 15 further comprising:

retrieving the digital bias value from the memory to produce a retrieved digital bias value; and using the retrieved digital bias value to convert to the analog bias voltage.

22. The method of claim 15 further comprising storing the digital bias value in the memory at periodic intervals.

* * * * *